Figure 1:
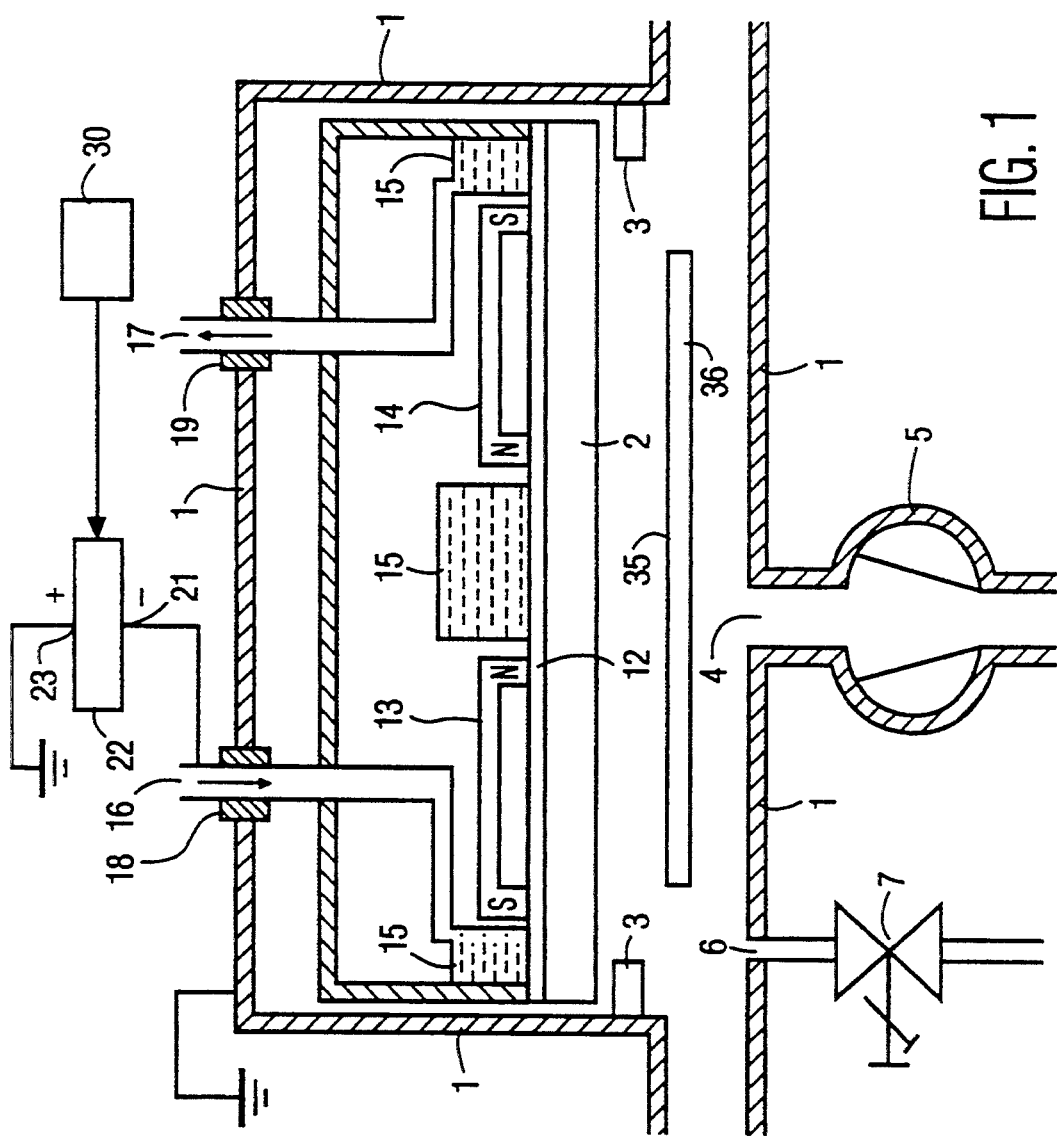

United States Patent [19]

Eggers et al.

[11] Patent Number: 5,380,419
[45] Date of Patent: Jan. 10, 1995

[54] CATHODE-SPUTTERING APPARATUS COMPRISING A DEVICE FOR MEASURING CRITICAL TARGET CONSUMPTION

[75] Inventors: Gerhard F. Eggers, Isernhagen; Horst-Christian Langowski, Hanover, both of Germany

[73] Assignees: U.S. Philips Corp.; Du Pont Optical Co., New York, N.Y.

[21] Appl. No.: 57,204

[22] Filed: May 5, 1993

Related U.S. Application Data

[63] Continuation of Ser. No. 339,925, Apr. 17, 1989, abandoned, which is a continuation of Ser. No. 95,279, Sep. 10, 1987, abandoned.

[30] Foreign Application Priority Data

Sep. 10, 1986 [DE] Germany .................. 3630737

[51] Int. Cl.$^6$ .................. C23C 14/34
[52] U.S. Cl. .................. 204/298.03; 204/192.13
[58] Field of Search .................. 204/298.03, 192.13, 204/298.32

[56] References Cited

U.S. PATENT DOCUMENTS

| | | | |
|---|---|---|---|
| 4,324,631 | 4/1982 | Meckel et al. | 204/192 M |
| 4,374,722 | 2/1983 | Zega | 204/298 |
| 4,379,040 | 4/1983 | Gillery | 204/192 P |
| 4,407,708 | 10/1983 | Landau | 204/192 R |
| 4,426,264 | 1/1984 | Munz et al. | 204/192 R |
| 4,545,882 | 10/1985 | McKelvey | 204/192 R |

FOREIGN PATENT DOCUMENTS 8419083 12/1985 Germany .
58-81968 5/1983 Japan .
2149034A 6/1985 United Kingdom .

OTHER PUBLICATIONS

J. L. Vossen et al., Thin Film Processes, Academic Press, New York, 1978, pp. 14–33.

*Primary Examiner*—John Niebling
*Assistant Examiner*—William T. Leader
*Attorney, Agent, or Firm*—Norman N. Spain

[57] ABSTRACT

A cathode-sputtering apparatus for the surface-coating of objects has a vacuum chamber which contains a helium-group gas, in which chamber a target cathode and an anode are arranged. A voltage for producing plasma discharges is applied to these electrodes and a magnetic field is applied, which intensifies the plasma discharges and concentrates them at the location of the target cathode. For measuring a critical target-consumption condition, at least one probe is provided in the target cathode, which probe is actuated when the target material is eroded up to the probe.

12 Claims, 4 Drawing Sheets

CATHODE-SPUTTERING APPARATUS COMPRISING A DEVICE FOR MEASURING CRITICAL TARGET CONSUMPTION

This is a continuation of application Ser. No. 07/339,925, filed Apr. 17, 1989, now abandoned which is continued of Ser. No. 07/095,279 filed on Sep. 10, 1987, now abandoned.

The invention relates to a cathode-sputtering apparatus for coating surfaces of objects, having a vacuum chamber which contains a helium-group gas and in which a target cathode and an anode are arranged to which a voltage is applied to produce plasma discharges, a magnetic field, which intensifies the plasma discharges and concentrates them at the area of the target cathode, and a device for measuring the target-consumption condition being provided.

In cathode-sputtering apparatuses of this type material is removed from the target cathode and settles on the surfaces of the objects to be coated. For this reason it is desirable to measure the consumption of the target cathode or to obtain an alarm signal before consumption is complete. Complete consumption of the target cathode is undesirable because the cathode rear plate or parts of the cathode-sputtering apparatus are then also eroded and damaged.

In equipment of this type it is known to measure the target-cathode consumption indirectly. This may be effected, for example, by measuring the electrical impedance of the cathode-anode arrangement by measuring the target temperature or by measuring the change in magnetic field. For example, from DE-OS 34 25 659 a method of controlling a sputtering apparatus is known, in which specific measurement quantities are compared with predetermined values in order to ascertain whether the target has eroded so far that adjustment of the plasma parameters is necessary or that the target is to be regarded as consumed. These measurement quantities are the operating points selected for the voltage and current of the plasma and for the magnetic field. This means that the impedance of the cathode-anode arrangement or a change in magnetic field is measured. Further, DE-OS 34 25 344 describes a magnetron sputter-coating source in which the magnetic field is sensed by means of a Hall element arranged in the proximity of the target cathode. The change in magnetic field provides information about the target consumption. DD-PS 220 618 describes a circuit arrangement for determining target wear in sputter equipment, in which a d.c. measurement quantity is employed which depends on the power consumed by the plasmatron. In this way information about the target-cathode consumption is derived from the power consumption of the plasmatron. However, all these methods have in common that they only enable an indirect measurement to be carried out and thus cannot provide a precise measure of the target-cathode consumption. Moreover, these methods to some extent only indicate a statistical mean consumption and thus do not provide information on whether locally the material already may have been eroded completely or almost completely.

From European Patent Application 0,046,154. which corresponding to U.S. Pat. No. 4,500,409 it is further known to arrange a sealed chamber filled with pressurized gas behind the target cathode in a cathode-sputtering apparatus. The pressure of the gas in the chamber is measured and in the case of a drop in pressure an alarm is given or the apparatus is switched off, because the target cathode is then fully eroded at least locally. However, this arrangement has the disadvantage that a conclusion about the target consumption cannot be drawn until the target has already been consumed completely at at least one location. Therefore, this method cannot be used in particular in those cases in which a very pure coating is needed. In such cases erosion of a rear plate, which is generally provided on the target cathode, is impermissible. In addition, the gas-tight chamber greatly complicates the construction of the equipment.

It is the object of the invention to provide a device in a cathode-sputtering apparatus of the type defined in the opening paragraph, which provides a reliable indication of a critical condition of target-cathode material consumption before complete consumption of the material and which can also be realized simply.

According to the invention this object is achieved in that for measuring a critical condition of target consumption at least one probe is provided in the target cathode, which probe responds when the target material has eroded up to probe.

In the target cathode a probe is arranged, for example in an aperture in the form of a bore or groove, to indicate that the target material surrounding the probe has been consumed completely at at least one side. The probe is positioned in the target cathode in such a way that it responds already before complete erosion of the material. Therefore, the probe is generally arranged at the location of the rear wall of the target cathode. If the probe is arranged at a location of intensified erosion this enables an alarm signal to be obtained by simple means before complete consumption of the target cathode at any other location, which signal indicates that complete consumption of the target cathode is imminent. This is very important because any down-time in a cathode-sputtering plant is uneconomical. The apparatus in accordance with the invention thus enables unnecessary down-periods to be avoided. At the same time the risk of a complete erosion of the target cathode is eliminated, which is of particular importance when stringent requirements are imposed on the coating purity of the surfaces to be coated.

In a further embodiment of the invention the probe contains a pressurized gas, the critical condition of target consumption being marked by a drop in gas pressure.

The probe for detecting the critical condition of target consumption may comprise, for example, a tube containing a pressurized gas. The pressure of this gas is detected. A drop in gas pressure immediately indicates that the probe is no longer imperforate as a result of erosion of the surrounding target-cathode material.

In a further embodiment of the invention the probe is provided with a chamber which is connected to a pressure switch by a pressure-tight tube connection, and the chamber and the ruse are filled with a gas, so that in the case of a drop in gas pressure the pressure switch is actuated as a result of the critical target-consumption condition being reached.

This enables the pressure of the gas in the probe to be measured with simple means. When the pressure switch is actuated an alarm signal may be given; however, alternatively the cathode-sputtering apparatus may be switched off directly.

In a further embodiment of the invention the target cathode is formed with a bore which is connected to a pressure switch by a pressure-tight tube connection and the bore and the tube are filled with a pressurized gas, so that the pressure switch is actuated when the gas pressure drops as a result of the critical target-consumption condition being reached.

In the simplest case the probe may be constituted by a simple bore in the target cathode, which bore is connected to a pressure switch by a pressure-tight tube connection. If the target-cathode material surrounding the bore has been consumed locally the gas escapes and the pressure switch is actuated. Thus, despite a simple construction a reliable measurement of a critical condition of target consumption is possible.

In a further embodiment of the invention the probe comprises an electrically conductive measurement lead whose contact with the discharge plasma is detected electronically.

Apart from the possibility of measuring the pressure of a gas in the probe it is also possible to arrange an electrically conductive measurement lead in the probe, contact of said lead with the discharge plasma as a result of the critical condition of target consumption being reached being detected electronically. The measurement lead then merely has to be connected to an electronic processing means, which is generally arranged outside the chamber. The electric potential of the measurement lead can be determined as follows. When the critical target consumption is reached, that is when the target material is eroded up to the probe, the discharge plasma flows into the measurement probe and also surrounds the measurement lead. The plasma ions have positive charges and influence the electric potential of the measurement lead accordingly. This change in measurement-lead potential is detected by the electronic processing means, which subsequently supplies an appropriate signal.

In a further embodiment of the invention the measurement lead is arranged in a ceramic tube surrounded by a metal tube, and both tubes are locally open to one side, so that at this location the measurement lead borders on the target material to be removed.

It is found to be advantageous to arrange the measurement lead in a ceramic tube because such a tube is an electrical insulator. The ceramic tube is surrounded by a metal tube. Both tubes are locally open to the side of the target cathode to be eroded. If the material of the target cathode is eroded up to this location, the measurement lead comes in electrical contact with the discharge plasma which, as described above, can be detected electronically.

In a further embodiment of the invention the probe is arranged at the location with the highest rate of consumption of the target electrode. Generally, the location with the highest rate of consumption of the target electrode is known empirically. In such cases it will be no problem to arrange one or more probes at these locations.

In a further embodiment of the invention the magnetic field of the cathode-sputtering apparatus is stronger in a specific area of the target cathode than in the other areas and the probe is arranged in said specific area.

If no well-defined target-cathode area with an intensified rate of consumption is known, or if there is no such area, it is possible to make the magnetic field in a specific area stronger than in the other areas. As a result of this, the target-cathode material at this location will be consumed at a faster rate than in the other areas. The probe for measuring the critical target-consumption condition is then arranged in this area and indicates when the critical target-consumption condition in this area is reached, which in any case is sooner than in the other areas of the target cathode.

In yet another embodiment of the invention-the target cathode, which is made of the metal to be deposited, is provided with a rear plate of another metal, and the probe is arranged in an area bordering on the rear plate in the metal to be deposited, Generally, the target cathode, which is made of the material to be deposited, is provided with a rear plate which is also made of a metal. It is then advantageous to arrange the probe in the boundary areas between the two metals. Generally, this will be effected in such a way that in an area bordering on the rear plate the metal to be deposited is formed with a bore into which the probe is fitted.

Figure 2:
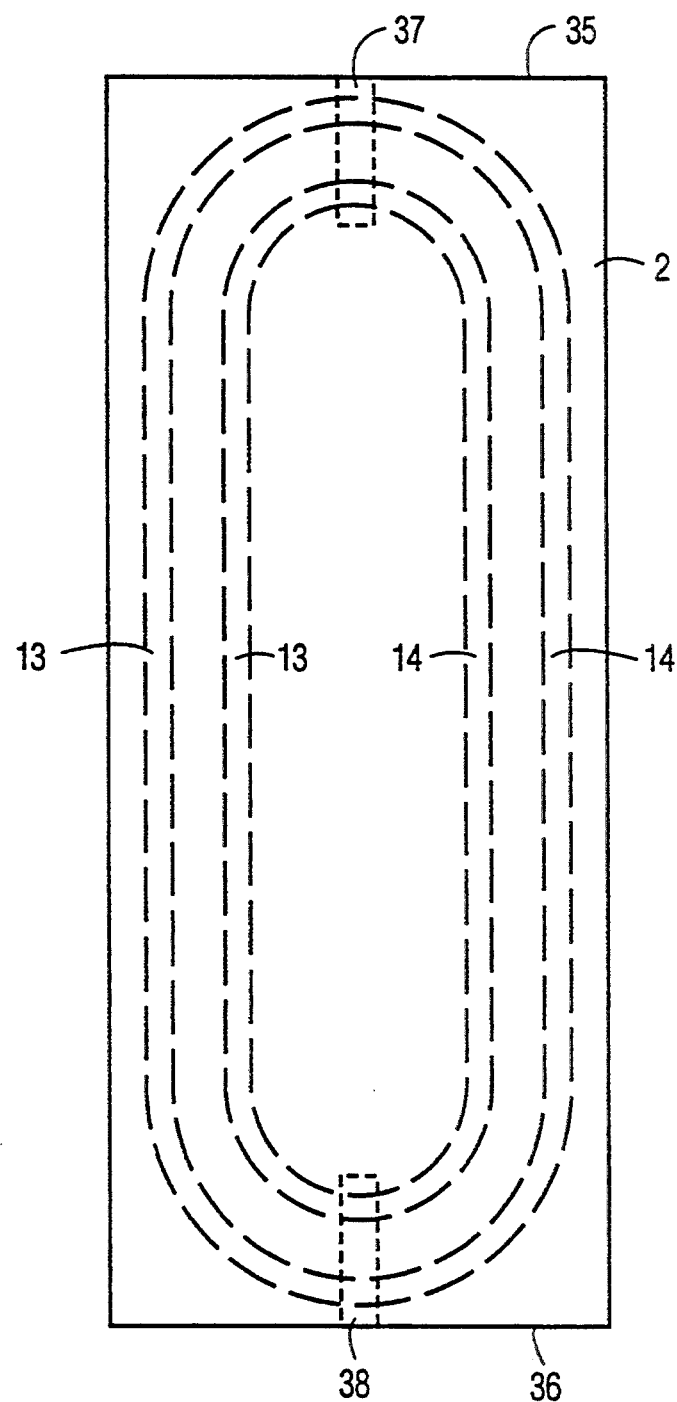
Figure 3:
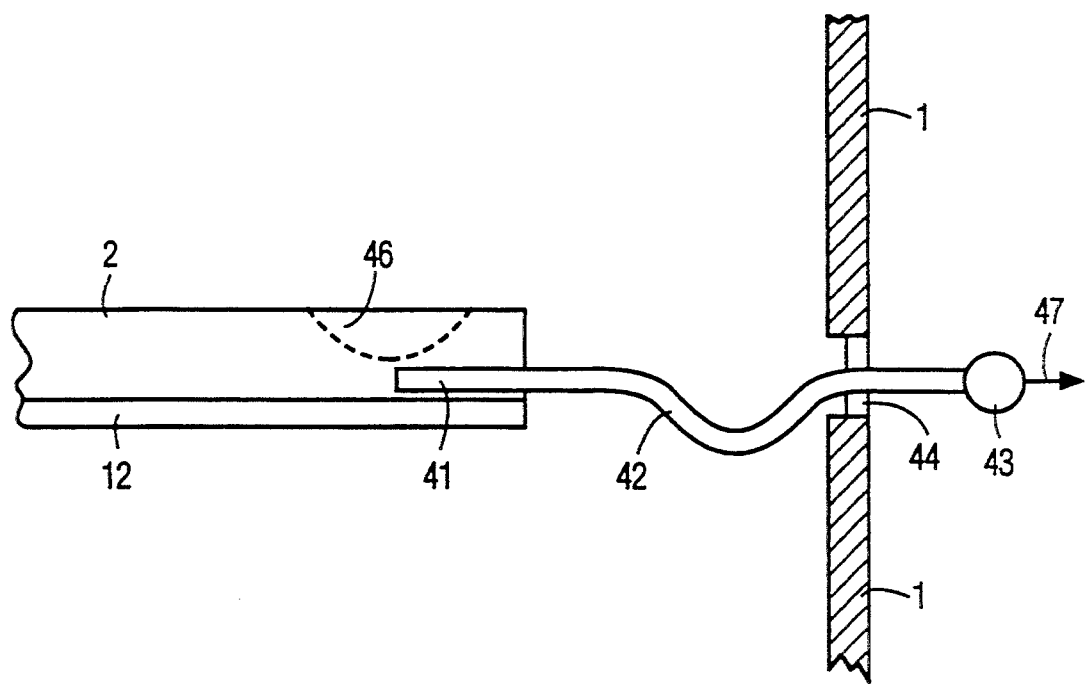
Figure 4:
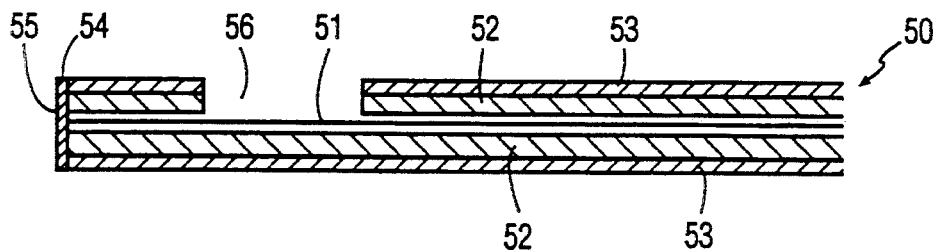
Figure 5:
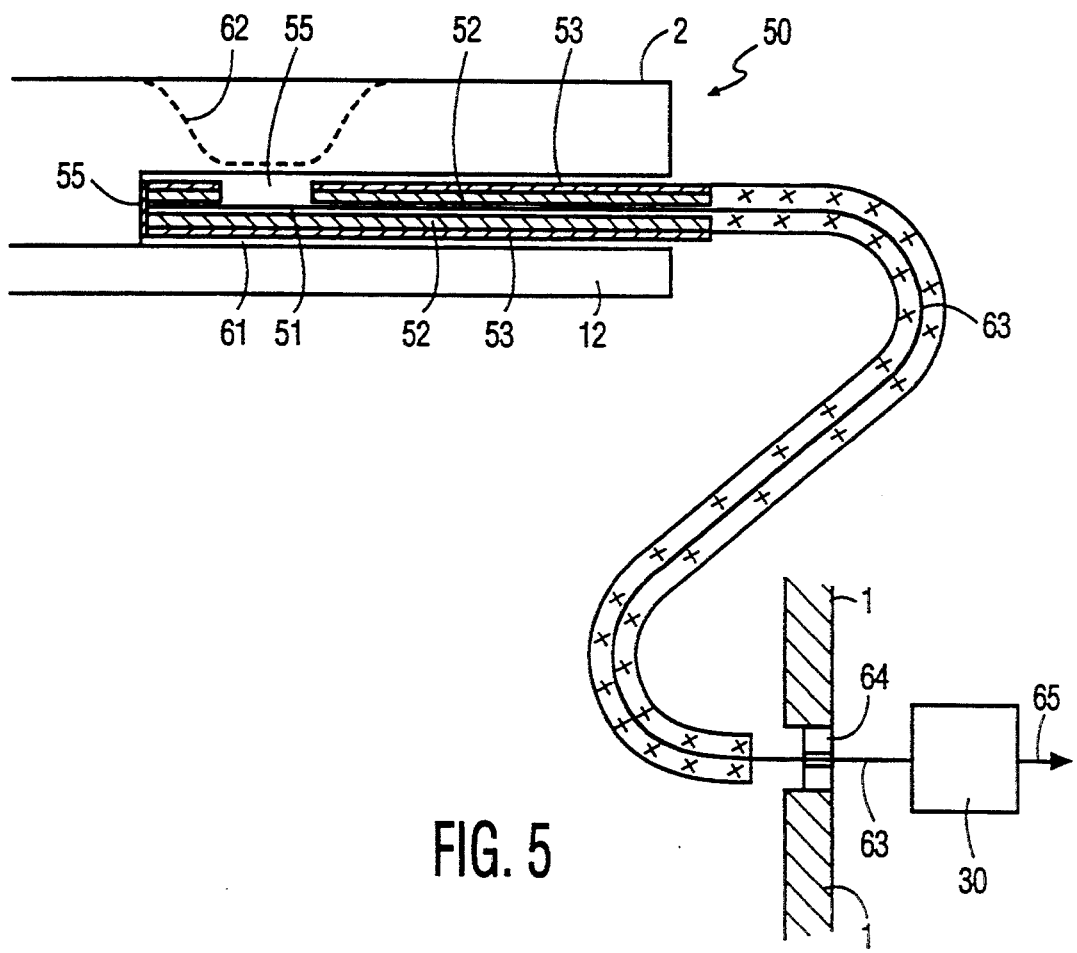

Some embodiments of the invention will now be described in more detail, by way of example, with reference to the accompanying drawings. In the drawings:

FIG. 1 is a partly sectional view of a cathode-sputtering apparatus for coating object surfaces, FIG. 2 is a plan view of a target cathode of the apparatus shown in FIG. 1, FIG. 3 is a sectional view of a first example of a probe in a target cathode, FIG. 4 is a sectional view of a second example of a probe, FIG. 5 is a sectional view of a target cathode provided with a probe as shown in FIG. 4.

FIG. 1 is a sectional view of a cathode-sputtering apparatus for coating object surfaces, comprising a vacuum chamber 1 in which a target cathode 2 and an anode 3 are arranged. The vacuum chamber 1 is sealed in an air-tight manner and can be evacuated by means of a pump 5 which is connected to an opening 4. By way of second opening 6 a helium-group gas is fed into the chamber 1 through a metering valve 7. The chamber has two ports, which open to the exterior and which, in a manner not shown, serve for introducing the objects to be coated into the chamber and removing these objects after coating. The ports terminate in tubular portions which, in a manner not shown and in the same way as the chamber I itself, are sealed in an air-tight manner with respect to the outer atmosphere. The anode 3 extends as a ring in the vacuum chamber 1 and the cathode 2 is arranged inside the chamber on an electrically conductive holder in the upper part of the chamber 1. For this purpose the target cathode 2 is connected to the holder by a rear plate 12. Two devices 13 and 14 for generating a magnetic field are arranged in the holder above the rear plate 12 of the target cathode 2. The magnetic fields are directed towards the rear plate 12 with their north poles and south poles respectively and in some parts of the target cathode they extend substantially parallel to this cathode. Between the magnet devices 13 and 14 cooling ducts 15 are formed in the holder, through which a coolant flows. The coolant is Supplied to the ducts through a tube 16 and is discharged through a tube 17. The tubes 16 and 17 are led through the chamber 1 by means of seals 18 and 19. At least the seal 18 is constructed to provide electrical insulation between the tube 16 and the wall of the chamber 1. Further, at least the tube 18 and, if desired, also the tube 17 is electrically conductive.

By means of the rear plate 12 and the tube 18, which is electrically connected to the rear plate 12 by at least one of the cooling ducts 15, the cathode 2 is connected to a negative terminal 21 of a voltage source 22. A positive terminal 23 of the voltage source 22 is connected to earth. The anode 3 arranged in the chamber 1 is also connected to earth. The voltage source 22 can be controlled by a processing unit 30, which in a manner not shown receives measurement signals from a probe. How the electronic processing unit 30 and the probe, not shown, function will be described in detail with reference to FIGS. 3 to 5.

The cathode-sputtering apparatus shown in FIG. 1 operates as follows:

By means of the voltage source 22 a voltage which is negative relative to the positive anode 3 is applied to the target cathode 2. The target cathode and the anode are located in the vacuum chamber 1 which is filled with a helium-group gas. When a suitable voltage is applied plasma discharges will be produced in the gas between the two electrodes. By means of the magnet devices 13 and 14 these plasma discharges are concentrated at the target-cathode area. This promotes bombardment of the surface of the target cathode 2 by the positive gas ions, resulting in particles of the cathode metal being removed. These metal particles settle on a surface 35 of a planar object 36 shown in sectional view in FIG. 1. In this way the surface 35 of the object 36 is coated with a thin layer of the same material as the target cathode 2. The parameters for adjusting the intensity of the plasma discharges are the gas pressure, the voltage applied between the electrodes and, if applicable, the strength of the magnetic field.

FIG. 2 shows the target electrode of FIG. 1 in plan view from the anode side. In this example the target cathode 2 has a substantially rectangular shape. The plan view of FIG. 2 also schematically shows the magnet devices 13 and 14. These devices are arranged in the form of an oval. In the example shown in FIG. 2 the magnet devices cover a comparatively small radius at the ends 36 of the target cathode, so that a comparatively strong magnetic field is produced in these areas. For this reason the target-cathode material is removed at a comparatively fast rate in these areas. Therefore, it is useful to arrange a probe for measuring a critical target-consumption condition in one or in two of these areas. The Figure diagrammatically shows two possible locations 37 and 38 for such probes. Hereinafter, two examples of such probes will be described in more detail with reference to FIGS. 3 to 5, which probes may be used, for example, in a cathode-sputtering apparatus as shown in FIG. 1 or in a target cathode as shown in FIGS. 1 and 2. When a critical target-consumption condition is reached these probes should supply a suitable signal to the processing unit 30, shown schematically in FIG. 1, which unit controls the voltage source 22 and thus duly disconnects the voltage to the electrodes before complete consumption of the target cathode 2.

FIG. 3 is a sectional view of a first example of a probe for measuring a critical target-consumption condition together with a target cathode. At the rear the target cathode 2, which may be, for example, of a construction as shown in FIGS. 1 and 2, carries a rear plate 12. The target cathode itself may be made of, for example, aluminum and the rear plate may be made of, for example, copper. In an area near the rear plate 12 the target cathode 2 shown in FIG. 3 has a bore 41. This bore is connected to a pressure sensor 43 by a flexible but gas-tight electrically insulating tube 42. The tube 42 is led out through a seal 44. The seal 44 is connected to a wall of the chamber of a cathode-sputtering apparatus, for example the chamber 1 shown in FIG. 1. Both the bore 41 in the target cathode and the tube 42 are filled with a gas. The pressure of this gas is measured by the pressure sensor 43. By way of example the Figure shows an eroded portion 46 in the target cathode 2. When this portion 46 is eroded up to the bore 41, the pressurized gas in the bore 41 and the tube 42 escapes through the opening then formed. As a result of this, the pressure in the system drops, which is signalled by the pressure sensor 43. This may be effected, for example, in such a way that the pressure sensor 43 supplies an electric signal to the electronic processing unit 30 shown schematically in FIG. 1, which unit again interrupts the voltage applied to the electrodes 3 and 2.

Instead of the bore 41 in FIG. 3 it is possible to arrange a probe in such a bore, which probe is again connected to the pressure sensor by a tube and has a chamber filled with a gas. The probe should then be made of the same material as the target cathode.

FIG. 4 is a sectional view of a second example of a probe for measuring a critical target-consumption condition. This example concerns an electrically operating probe 50. In the interior of the probe 50 a measurement lead 51 is arranged. The measurement lead 51 is surrounded by a ceramic tube 52 and the latter is surrounded by a metal tube 53. At the first end 54, which is first inserted into a bore or groove in a target cathode not shown in FIG. 4, the measurement lead 51, the ceramic tube 52 and the metal tube 53 are terminated with an electrically insulating cap 55. This cap 55 may be secured by means of, for example, a ceramic cement. The ceramic tube 52 and the metal tube 53 are open over a semi-cylindrical area 56. In the assembled condition this area 56 faces that deposition side of the target cathode.

This is illustrated in FIG. 5, which is a sectional view of the electrically operating probe shown in FIG. 4 and a target cathode, for example the target cathode 2 shown in FIG. 1 and 2. The probe 50 is fitted into a bore 61 in the target cathode 2. The bore 61 is formed in an area which borders on the rear plate 12. FIG. 5 by way of example shows an eroded portion 62 in the target cathode 2. In the Figure this eroded portion 62 is shown briefly before breakthrough to the probe. The measurement lead 51 in the probe is connected to an electronic processing unit, for example the unit 30 shown in FIG. 1, BY an insulated cable 63. The cable is led through a feed-through insulator 64. This feed-through insulator 64 is situated, for example, in a wall of the vacuum chamber shown in FIG. 1. The measurement lead 51 of the probe 50 is thus connected to the electronic processing unit 30 by the cable connection 63. The electronic processing unit 30 measures the electric potential of the measurement lead 51. When the eroded portion 62, shown schematically in the Figure, reaches the open area 56 of the probe, the measurement lead comes into contact with the positively charged discharge plasma. The changing electric potential of the measurement lead 51, which is connected to the unit 30 by the cable connection 63, is detected by the electronic processing unit 30 and an appropriate signal 65 is supplied, which may serve for example for interrupting the voltage supplied to the electrodes of the cathode-sputtering apparatus, In addition to the example shown in FIG. 5 other electronically operating versions of such a probe are possible. Alternatively, the measurement lead may be, for example, a resistance wire whose termination resistance relative to the electronic measurement unit 30 changes upon melting.

Many more alternative embodiments of the invention may be designed having the characteristic feature of the invention that the measuring probe is placed in the target material itself, without departing from the scope of the appended claims. Such alternative embodiments will appear to the man skilled in the art, depending on the kind and shape of target material and the kind of alarm or switching signal desired.

We claim:

1. A cathode-sputtering apparatus for coating surfaces of objects, said apparatus comprising a vacuum chamber which contains a helium-group gas, a target cathode with at least one aperture and an anode arranged in said chamber, means for applying a voltage between said cathode and said anode to produce a plasma discharge, means for producing a magnetic field for intensifying the plasma discharge and concentrating it at the area of the target cathode, wherein for measuring a critical condition of target consumption at least one probe is located in said at least one aperture in the target cathode, which probe is adapted to respond only when the target material has eroded and the integrity of the probe is destroyed and wherein the probe contains a gas, the critical condition of target-consumption being marked by a drop in gas pressure in the probe.

2. A cathode-sputtering apparatus as claimed in claim 1, wherein the probe is arranged at the location with the highest rate of consumption of the target electrode.

3. A cathode-sputtering apparatus as claimed in claim 1 wherein the means for producing a magnetic field is adapted to produce a magnetic field which is stronger in a specific area of the target cathode than in the other areas, and in that the probe is arranged in said specific area.

4. A cathode-sputtering apparatus as claimed in claim 3, wherein the target cathode, which is made of the metal to be deposited, is provided with a rear plate of another metal, and wherein the probe is arranged in an area bordering on the rear plate in the metal to be deposited.

5. A cathode-sputtering apparatus as claimed in claim 4, wherein the metal to be deposited is aluminum and wherein the rear plate is made of copper.

6. A cathode-sputtering device as claimed in claim 1, including a pressure switch and wherein said probe is a pressure tight tube connection and wherein said pressure switch is actuated when the integrity of the probe is destroyed.

7. A cathode sputtering apparatus for coating surfaces of objects, said apparatus comprising a vacuum chamber containing a helium-group gas, a target cathode with at least one aperture and an anode arranged in said chamber, means for applying a voltage between said cathode and anode to produce a plasma discharge, means for producing a magnetic field for intensifying the plasma discharge and concentrating it at the area of the target cathode, wherein for measuring a critical condition of target consumption at least one probe is located in said at least one aperture in the target cathode, which probe is adapted to respond only when the target material has eroded up to the probe, and is contacted by the discharge and wherein the probe comprises an electrically conductive measurement lead whose contact with the discharge plasma is detected electronically and which measurement lead has an electric potential influenced by positive charges of ions of the discharge plasma.

8. A cathode sputtering apparatus for coating surfaces of objects, said apparatus comprising a vacuum chamber containing a helium-group gas, a target cathode with at least one aperture and an anode arranged in said chamber, means for applying a voltage between said cathode and anode to produce a plasma discharge, means for producing a magnetic field for intensifying the plasma discharge and concentrating it at the area of the target cathode, wherein for measuring a critical condition of target consumption at least one probe is located in said at least one aperture in the target cathode, which probe is adapted to respond only when the target material has eroded up to the probe, and is contacted by the discharge, wherein the plasma probe comprises an electrically conductive measurement lead whose contact with the discharge plasma is detected electronically and which measurement lead has an electric potential influenced by positive charges of ions of the discharge plasma, and wherein the measurement lead is arranged in a ceramic tube surrounded by a metal tube which tube is locally open at one side so that, at the location of this opening, the measurement lead borders on the target material to be eroded.

9. A cathode-sputtering apparatus as claimed in claims 7 or 8, wherein the probe is arranged at the location with the highest rate of consumption of the target electrode.

10. A cathode-sputtering apparatus as claimed in claims 7 or 8, wherein the means for producing a magnetic field is adapted to produce a magnetic field which is stronger in a specific area of the target cathode than in the other areas, and in that the probe is arranged in said specific area.

11. A cathode-sputtering apparatus as claimed in claim 10, wherein the target cathode, which is made of the metal to be deposited, is provided with a rear plate of another metal, and wherein the probe is arranged in an area bordering on the rear plate in the metal to be deposited.

12. A cathode-sputtering apparatus as claimed in claim 11, wherein the metal to be deposited is aluminum and wherein the rear plate is made of copper.

* * * * *